United States Patent
Ban et al.

(10) Patent No.: US 10,680,077 B2
(45) Date of Patent: Jun. 9, 2020

(54) FABRICATION OF HETEROJUNCTION BIPOLAR TRANSISTORS WITH A SELECTIVELY GROWN COLLECTOR/SUB-COLLECTOR

(71) Applicant: Duet Microelectronics LLC, Raritan, NJ (US)

(72) Inventors: Keun-Yong Ban, Raritan, NJ (US); Robert J. Bayruns, Raritan, NJ (US)

(73) Assignee: XG MICROELECTRONICS INC., Raritan, NJ (US)

( * ) Notice: Subject to any disclaimer, the term of this patent is extended or adjusted under 35 U.S.C. 154(b) by 16 days.

(21) Appl. No.: 16/021,615

(22) Filed: Jun. 28, 2018

(65) Prior Publication Data

US 2020/0006520 A1 Jan. 2, 2020

(51) Int. Cl.
| | |
|---|---|
| *H01L 21/8249* | (2006.01) |
| *H01L 29/66* | (2006.01) |
| *H01L 29/737* | (2006.01) |
| *H01L 29/08* | (2006.01) |
| *H01L 29/10* | (2006.01) |
| *H01L 29/205* | (2006.01) |

(52) U.S. Cl.
CPC .... *H01L 29/66318* (2013.01); *H01L 29/0817* (2013.01); *H01L 29/0821* (2013.01); *H01L 29/1004* (2013.01); *H01L 29/205* (2013.01); *H01L 29/7371* (2013.01)

(58) Field of Classification Search
CPC .................................................. H01L 29/66318
USPC .......................................................... 257/197
See application file for complete search history.

(56) References Cited

U.S. PATENT DOCUMENTS

| | | | |
|---|---|---|---|
| 5,672,522 A | 9/1997 | Streit et al. | |
| 5,981,985 A | 11/1999 | Yang et al. | |
| 2002/0011649 A1* | 1/2002 | Schwartzmann | ... H01L 29/0821 257/565 |
| 2006/0267047 A1* | 11/2006 | Murayama | ........ H01L 29/41708 257/197 |

FOREIGN PATENT DOCUMENTS

WO WO-9616472 A1 * 5/1996 ........... H03B 5/1876

* cited by examiner

*Primary Examiner* — Ajay Arora
(74) *Attorney, Agent, or Firm* — John H. Choi & Associates

(57) ABSTRACT

A heterojunction bipolar transistor (HBT) and methods of fabrication provide a substrate, a base having a first lateral area, an emitter, a sub-collector having a second lateral area, and a collector above the sub-collector, wherein the second lateral area of the sub-collector is less than the first lateral area of the base, which enables the fabrication of HBTs with high linearity, as measured by an improved third order distortion (OIP3) parameter, while maintaining high gain; which enables the fabrication of HBTs with a selectively grown or overgrown collector/sub-collector; and which reduces a capacitance between the base and collector of the HBTs.

5 Claims, 9 Drawing Sheets

FABRICATION OF HETEROJUNCTION BIPOLAR TRANSISTORS WITH A SELECTIVELY GROWN COLLECTOR/SUB-COLLECTOR

FIELD

The present disclosure relates to transistors and in particular to heterojunction bipolar transistors with a reduced base-collector capacitance.

BACKGROUND

The performance of transistor devices often depends on the behavior of electrons, or electron holes, traveling from one portion of the transistor device to another. For example, parameters such as the gain or the linearity of a heterojunction bipolar transistor (HBT) may depend on the capacitance between the base and the collector of the bipolar transistor. Parasitic capacitance between the base and the collector would degrade the performance of the heterojunction bipolar transistor.

In the prior art, attempts have been made to improve the performance of bipolar transistors. For example, U.S. Pat. No. 5,672,522 discloses an HBT in which the sub-collector area is selectively ion-implanted. FIG. 1 shows the cross-sectional image of a GaAs-based HBT with a selectively silicon (Si) implanted sub-collector 54 fabricated on a semi-insulating GaAs substrate 50, upon which a collector 61, a base 58, and an emitter 60 are formed, with a base ohmic metal 62 on the base 58, and an emitter ohmic metal 64 on the emitter 60. In a first method, the sub-collector area 54 was defined by a typical Si-ion implantation on the selective area. The ion implantation process was followed by collector, base and emitter epitaxial growth. In a second method, oxygen ion implantation was executed on the pre-grown Si doped sub-collector region 54. The oxygen implanted area turns out to be highly resistive. However, in the device in FIG. 1, only the sub-collector area was reduced. In addition, a selective N+ sub-collector area was defined by ion implantation, which may cause ion damage, and in turn the ion damage may result in degrading crystal quality of the followed layers.

Also in the prior art, as shown in FIG. 2, U.S. Pat. No. 5,981,985 discloses an HBT in which overlapping is minimized between the base 13 and sub-collector region 11. FIG. 2 is a cross-sectional image of GaAs HBT with a selectively buried sub-collector 11, a collector 12, a base 13, an emitter 14, metals 25-27, and passivation elements 30. The sub-collector region 11 is defined by photolithography. The reduced sub-collector 11 is used as a template for the subsequent epitaxial growth. The subsequently fabricated collector, base and emitter layers conformally form on the top of the substrate 10. Most of the collector, base and emitter regions is etched off to minimize the area overlapping between collector 12 and sub-collector 11, which results in a significant reduction of the base-collector capacitance $C_{bc}$. However, in the device in FIG. 2, performance was limited or reduced since only the sub-collector area was reduced, and the layout for the device stacks was not properly organized since epitaxial overgrowth for device stacks was not planarized.

Also, in the prior art, known HBT structures have layouts where the sub-collector area is greater than the base area, such as shown in FIG. 4A, while the collector area is the same as the base area. A few different methodologies have been proposed in the prior art to reduce the parasitic base-collector capacitance $C_{bc}$. A significant reduction of the capacitance $C_{bc}$ allows for the fabrication of HBTs to boost up the speed of HBTs and improve their linearity. As shown in FIGS. 1-2, different device layouts have been implemented to decrease the base-collector capacitance $C_{bc}$. The two devices in FIGS. 1-2 use a reduced sub-collector region that is heavily Si doped. However, such prior art devices still suffer from the effects of excessive base-collector capacitance $C_{bc}$ and the resulting poor gain and poor linearity of such prior art devices.

SUMMARY

The following presents a simplified summary of some embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented later.

The present invention are HBTs and methods of fabrication to enable the manufacture of HBTs with high linearity, as measured by an improved third order distortion (OIP3) parameter, while maintaining high gain; to enable the manufacture of HBTs with a selectively grown or overgrown collector/sub-collector; and to reduce a capacitance between the base and collector of the HBTs. In addition, the present invention provides high crystal quality without ion damage on the surface of the HBTs, and provides a reduction of a unit cell footprint with an improvement of device integration efficiency. The present invention decreases the lateral extent of collector and/or sub-collector area in the HBT since the capacitance is inversely proportional to the area of the capacitors formed by the base and the collector of the HBT.

The present invention includes a transistor comprising: a substrate; a base having a first lateral area; an emitter; a sub-collector having a second lateral area; and a collector above the sub-collector and having a third lateral area; wherein the second lateral area of the sub-collector is less than the first lateral area of the base. In one embodiment, the second lateral area of the sub-collector is substantially equal to the third lateral area of the collector. In another embodiment, the second lateral area of the sub-collector is greater than the third lateral area of the collector, for example, the third lateral area is about one-third of the second lateral area. In a further embodiment, the second lateral area of the sub-collector is less than the third lateral area of the collector, for example, the second lateral area is about one-third of the third lateral area. At least one of the sub-collector and the collector is selectively grown. Alternatively, the collector is overgrown on the sub-collector. The collector is a dual collector. Alternatively, the collector includes a first layer and a second layer, and wherein a first collector doping density of the first layer is greater than the second collector doping density of the second layer. The second lateral area of the sub-collector being less than the first lateral area of the base reduces a base-collector capacitance, which increases the maximum gain Gmax of the transistor, increases the third order distortion (OIP3) parameter of the transistor, and increases the linearity of the transistor.

The present invention also includes a method for fabricating a transistor comprising: deposit a material on a substrate; perform photolithography and etching through the material to the substrate to form an exposed substrate area; selectively grow a sub-collector and/or a collector on the exposed substrate area; and form a base and an emitter. A second lateral area of the sub-collector is selectively grown to be less than a first lateral area of the base, which reduces a base-collector capacitance.

The present invention includes another method for fabricating a transistor comprising: deposit a sub-collector material on a substrate; perform photolithography and etching through the sub-collector material to the substrate to form an exposed substrate area and a sub-collector area; overgrow a collector on the exposed substrate area and on the sub-collector area; and form a base and an emitter. A second lateral area of the sub-collector is formed to be less than a first lateral area of the base, which reduces a base-collector capacitance.

BRIEF DESCRIPTION OF DRAWINGS

The foregoing summary, as well as the following detailed description of presently preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

Figure 1:
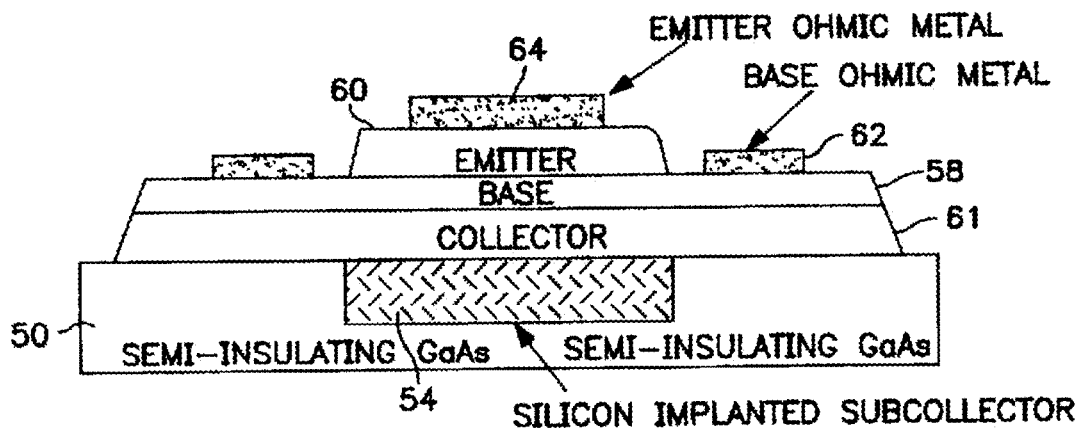
FIGS. 1-2 are cross-sectional views of HBTs in the prior art.
Figure 2:
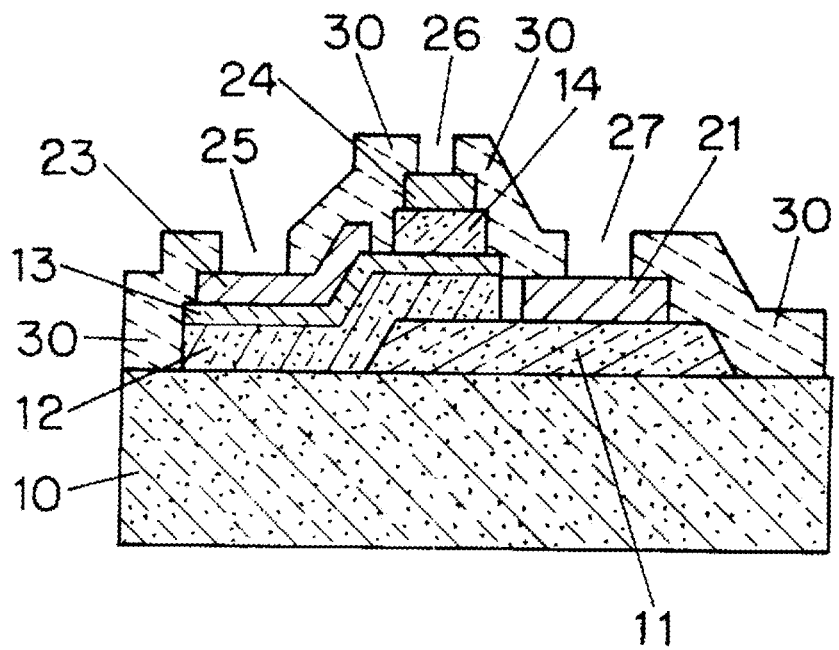

To facilitate an understanding of the invention, identical reference numerals have been used, when appropriate, to designate the same or similar elements that are common to the figures. Further, unless stated otherwise, the features shown in the figures are not drawn to scale, but are shown for illustrative purposes only.

DETAILED DESCRIPTION

Certain terminology is used in the following description for convenience only and is not limiting. The article "a" is intended to include one or more items, and where only one item is intended the term "one" or similar language is used. Additionally, to assist in the description of the present invention, words such as top, bottom, side, upper, lower, front, rear, inner, outer, right and left may be used to describe the accompanying figures. The terminology includes the words above specifically mentioned, derivatives thereof, and words of similar import.

Figure 3A:
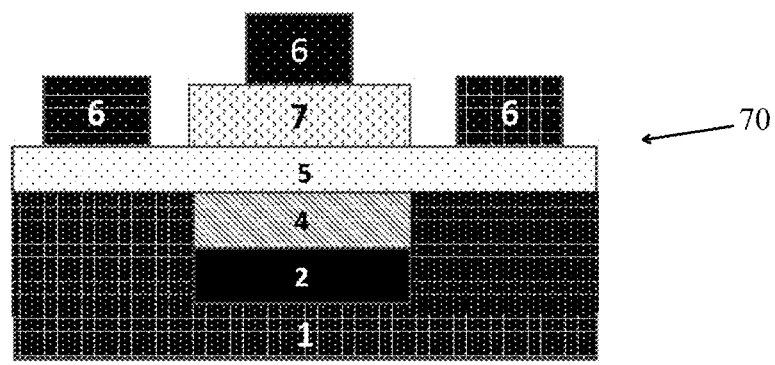
FIGS. 3A-3C are cross-sectional views of HBTs in the present invention.
Figure 3B:
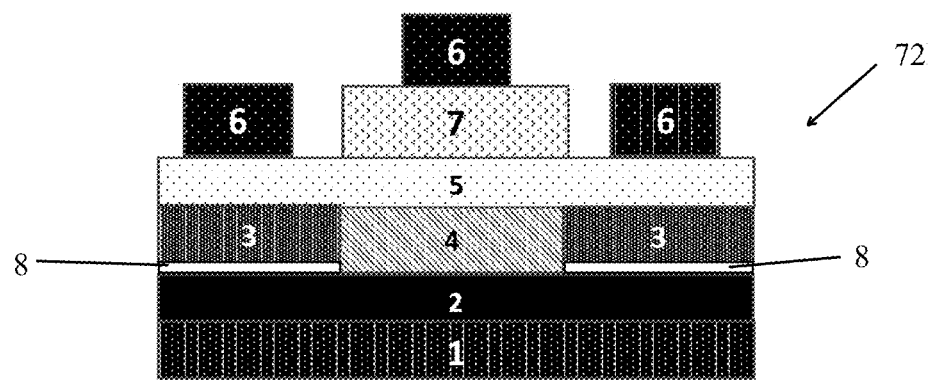
Figure 3C:
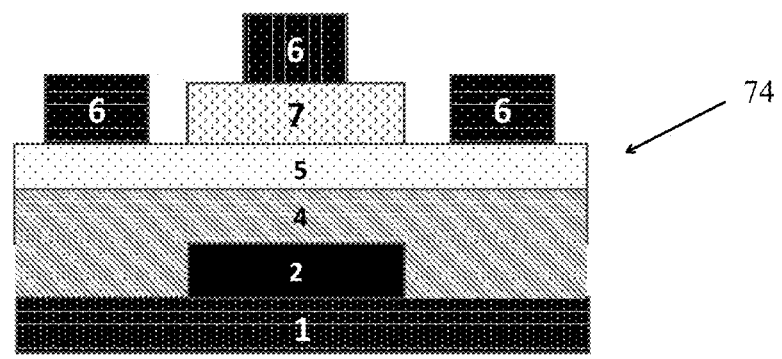

FIGS. 3A-3B illustrate different HBTs 70, 72, 74, respectively, formed by the methods of the present invention for fabrication of an HBT as described herein, each of which has a grown collector/sub-collector. As shown in FIG. 3A, the HBT 70 includes a substrate 1, a sub-collector 2, a collector 4, a base 5, ohmic metal contacts 6, and an emitter 7. The emitter layer 7 consists of n− InGaP emitter, n+ GaAs emitter cap and n+InGaAs in composition grading. As shown in FIG. 3B, the HBT 72 includes a substrate 1, a sub-collector 2, a resistive buffer 3, a collector 4, a base 5, ohmic metal contacts 6, an emitter 7, and an etch stop 8 between the sub-collector 2 and the buffer 3. As shown in FIG. 3C, the HBT 74 includes a substrate 1, a sub-collector 2, a collector 4, a base 5, ohmic metal contacts 6, and an emitter 7. The collector 4 in each of the HBTs 70, 72, 74 may be a dual collector, in which the collector has a first layer and a second layer, with a first collector doping density of the first layer being greater than the second collector doping density of the second layer. The first and second layers may have different thicknesses. The metal contacts 6 may be ohmic metal contacts, and the emitter 7 may be an emitter cap. In an example embodiment, the buffer 3 in FIG. 3B may be a GaAs-based buffer, and the etch stop 8 may be an InGaP-based etch stop. In example embodiments of each of the HBTs 70, 72, 74 of FIGS. 3A-3C, respectively, the emitter or emitter cap 7 may be an InGaAs-based emitter. The emitter layer 7 consists of n− InGaP emitter, n+ GaAs emitter cap and n+InGaAs in composition grading.

The HBT device stacks 70, 72, 74 of FIGS. 3A-3C, respectively, can be epitaxially grown on the top of a semi-insulating gallium arsenide (GaAs) substrate 1. The device stacks 70, 72, 74 comprise, for example, a heavily Si doped GaAs sub-collector 4, with a doping density of about $2\times10^{18}/cm^3$ to about $5\times10^{18}/cm^3$; a lightly Si doped GaAs collector 2, with a doping density of about $1\times10^{15}/cm^3$ to about $1\times10^{17}/cm^3$; a heavily carbon doped GaAs base 5, with a doping density of about $1\times10^{19}/cm^3$ to about $6\times10^{19}/cm^3$; and a lightly Si doped emitter 7 having a indium gallium phosphide ($In_{0.48}Ga_{0.52}P$) lattice matched to the GaAs substrate 1. The emitter layer 7 consists of n− InGaP emitter, n+ GaAs emitter cap and n+InGaAs in composition grading.

The collector 4 consists of two layers where the first collector doping is greater than the second collector doping. A heavily tellurium (Te) doped indium gallium arsenide (In0.5Ga0.5As) linearly graded contact and a heavily Si doped GaAs emitter cap are formed on the top of the InGaP emitter 7. The ohmic metal contacts 6 are formed on the top of the linearly graded InGaAs contact of the emitter 7 as well as on the base 5 and the sub-collector 4. The emitter layer 7 consists of n− InGaP emitter, n+ GaAs emitter cap and n+InGaAs contact layer.

Figure 4A:
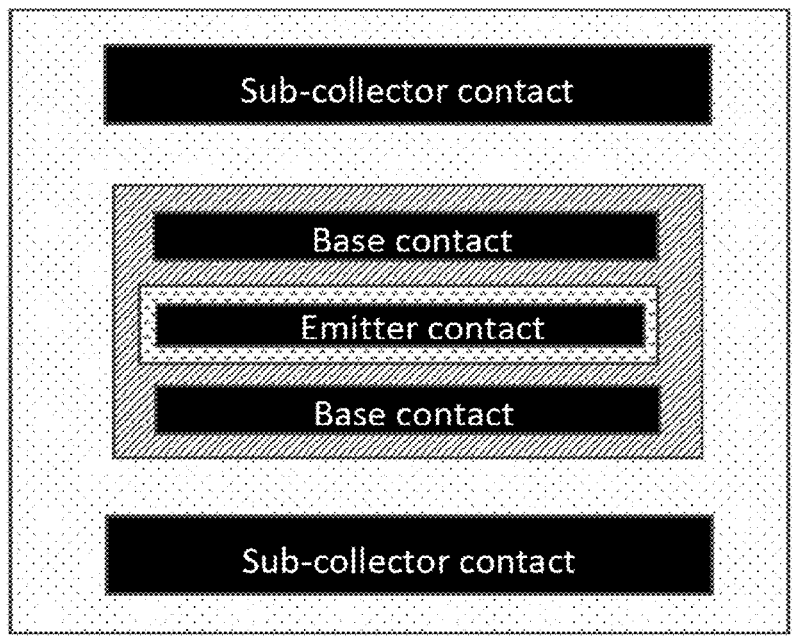
FIG. 4A is a top plan view of a layout of an HBT in the prior art.

While the HBT structures in the prior art have layouts where the sub-collector lateral area is greater than the base lateral area, as shown in FIG. 4A, the present invention as described herein reduces the $C_{bc}$ of an HBT by reducing the lateral extent of the N+ GaAs sub collector and/or N− GaAs collector regions relative to the base. FIGS. 3A-3C display the cross-sectional images of the HBT structures of the present invention, with the lateral extent of the collector and sub-collector reduced, for example, by the factor of about three in the HBTs 72, 74 in FIGS. 3B and 3C, respectively, whereas both the collector and sub-collector regions are simultaneously reduced in the HBT 70 in FIG. 3A, so that the ratio of the base area to the collector and/or sub-collector is about 3:1.

Figure 4B:
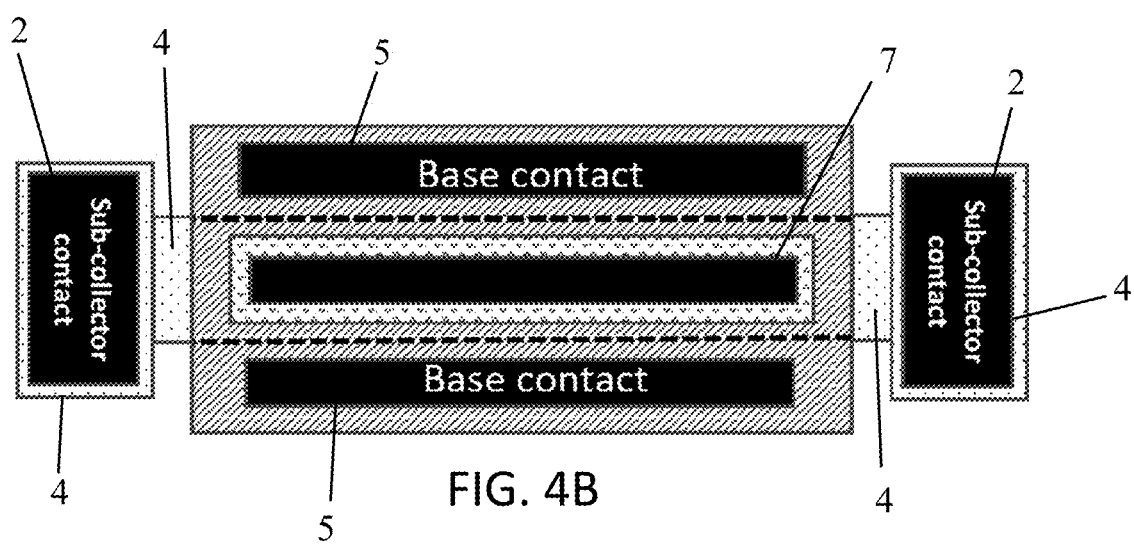
FIG. 4B is a top plan view of a layout of an HBT in the present invention.

FIGS. 4A-4B are top plan views of layouts of HBTs. FIG. 4B represents the HBT structure of the present invention for the HBTs 70, 72, 74 in FIGS. 3A-3C that have significantly reduced collector/sub-collector lateral area, compared to the HBT structures in the prior art as shown in FIG. 4A. As shown in FIG. 4B, the combined lateral area of the sub-collector 2 and the collector 4 of the HBT structures of the present invention is significantly reduced compared to the combined lateral area of the sub-collector 2 and the collector 4 of the HBT structures in the prior art as shown in FIG. 4A. Accordingly, for HBT structures as shown in FIGS. 4A-4B with comparable lateral areas of the base contacts 5, the ratio of the lateral areas of the sub-collector 2 and the collector 4 to the lateral area of the base in HBTs in the present invention is significantly less than the ratio of the lateral areas of the sub-collector 2 and the collector 4 to the lateral area of the base in HBTs in the prior art, resulting in a smaller base-collector capacitance $C_{bc}$ in HBTs of the present invention compared to the $C_{bc}$ of HBTs in the prior art. For example, the ratio of the lateral areas of the sub-collector 2 and the collector 4 to the lateral area of the base in HBTs in the present invention is 1:3. In the present invention, the ratio of the lateral areas of the sub-collector 2 and the collector 4 to the lateral area of the emitter in HBTs in the present invention may be about 1:1.

In addition to the advantage of the $C_{bc}$ reduction in the present invention, the device integration efficiency of HBTs of the present invention can be substantially improved since the footprint of the HBT unit cell is much smaller using the HBT structure of the present invention compared to the footprint of HBT unit cells in the prior art.

In the present invention, the reduced collector or collector/sub-collector region is represented as the collector 4 and the sub-collector 2 in FIG. 3A, and as the collector 4 in FIG. 3B. Such reduced collector or collector/sub-collector regions in FIGS. 3A-3B may be fabricated in the present invention via selective growth processes such as shown in FIGS. 5A-5E. In addition, the reduced sub-collector 2 in FIG. 3C is fabricated via overgrowth processes such as shown in FIGS. 6A-6E. The process flows for the selective growth and overgrowth provide the planarized sub-collector and/or collector regions, respectively.

Figure 5A:
FIGS. 5A-5E illustrate the steps of fabrication of an HBT in the present invention by selective growth.
Figure 5B:
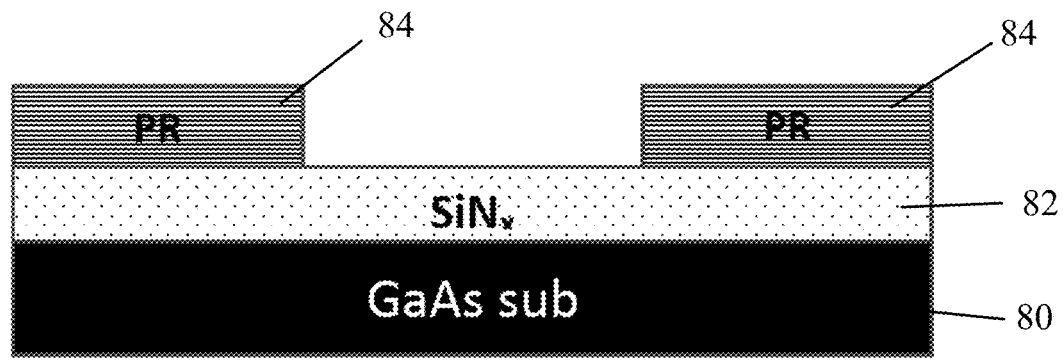
Figure 5C:
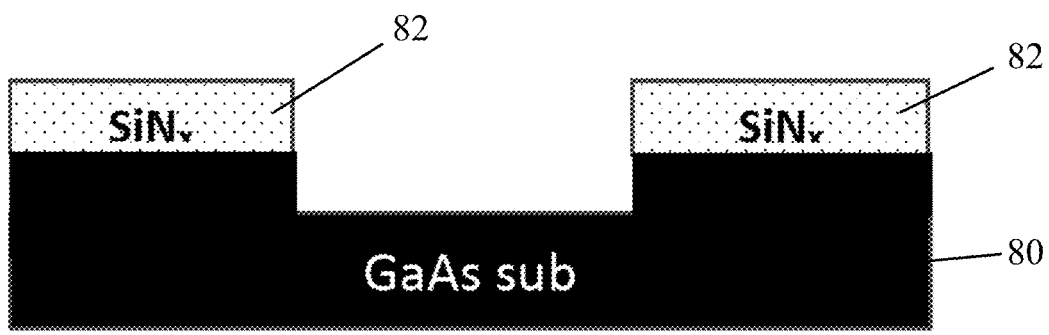
Figure 5D:
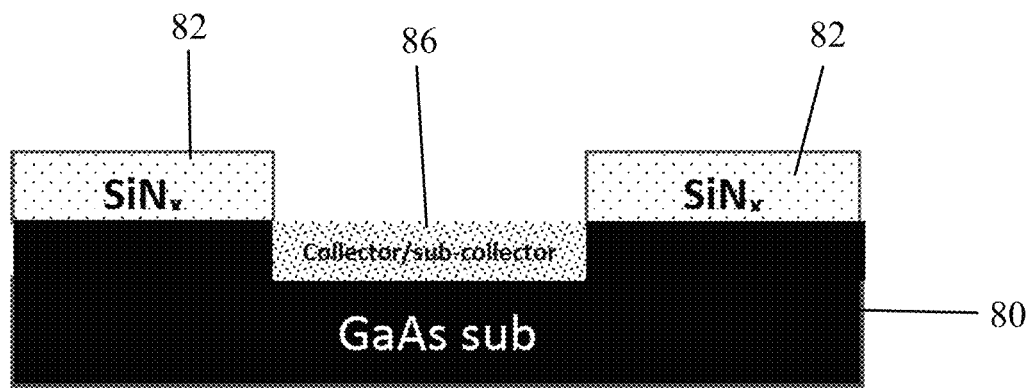

In a first approach for the realization of the HBT 70 in FIG. 3A, a selective growth process is pursued. As shown in FIG. 5A, at first, a $SiN_x$ dielectric material 82 is deposited on a GaAs substrate 80. The step in FIG. 5A is followed by photolithography and etching processes through the substrate 80, as shown in FIGS. 5B and 5C, by the depositing or use of photoresists (PR) 84, with an etching depth in the range of about 0 μm to about 2.5 μm of the substrate 80. The processed substrate goes through wet chemical cleaning to remove native oxide and residual contaminants. Then, as shown in FIG. 5D, a combination 86 of a heavily Si doped GaAs sub-collector, in the range of about 0.2 μm to about 2 μm, and lightly Si doped dual collector layers, in the range of about 0.5 μm to about 1.5 μm, are selectively grown on the exposed GaAs area by metal-organic chemical vapor deposition (MOCVD). The SiNx is etched off prior to the subsequent growth 88 of the base and emitter in the step shown in FIG. 5E.

Figure 5E:
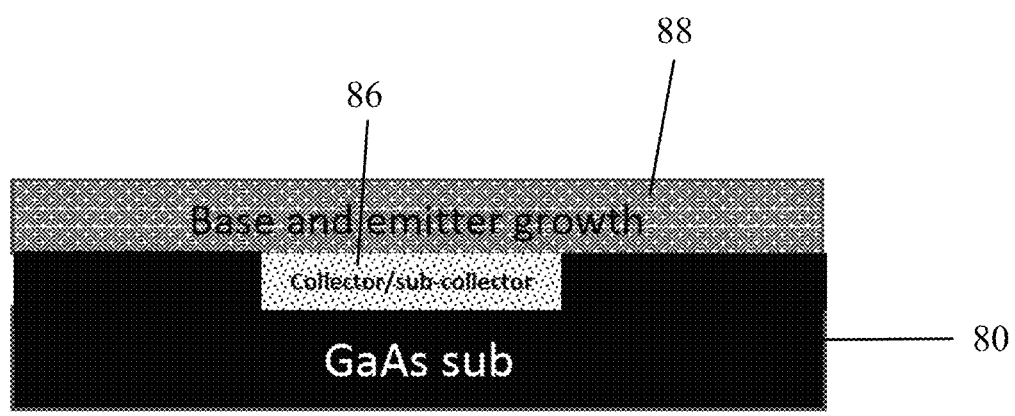

In a second approach for the realization of the HBT 72 in FIG. 3B, a selective growth process is used as well. Referring to FIG. 5A and FIG. 3B, a combination of a N+ GaAs sub-collector, in the range of about 0.2 μm to about 1 μm; an un-doped InGaP etch stop, in the range of about 1 nm to about 20 nm; and un-doped GaAs, in the range of about 0.5 μm to about 1.5 μm; are epitaxially grown on a GaAs substrate 80. At first, a SiNx dielectric material 82 is deposited on the un-doped GaAs 80. The step in FIG. 5A is followed by photolithography and selective etching through the un-doped GaAs and un-doped InGaP in the steps shown in FIGS. 5B-5C. The selective etching can be executed by reactive ion etching (RIE) or wet chemical etching. The lightly Si doped dual collector layers, in the range of about 0.5 μm to about 1.5 μm, are selectively grown on the exposed N+ GaAs sub-collector area by MOCVD as shown in FIG. 5D. The SiNx is etched off prior to the subsequent growth of further layers as shown in FIG. 5E. After the preliminary processes in FIGS. 5A-5E, a p+ GaAs base, a n– InGaP emitter, a n+ GaAs emitter cap and n+InGaAs contact layers are epitaxially grown by MOCVD.

Figure 6A:
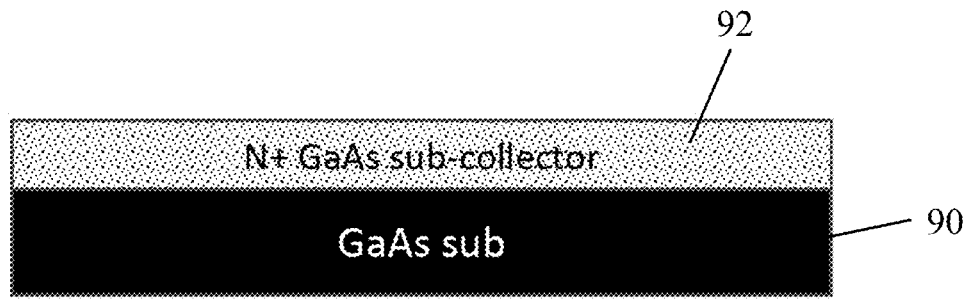
FIGS. 6A-6E illustrate the steps of fabrication of an HBT in the present invention by overgrowth.
Figure 6B:
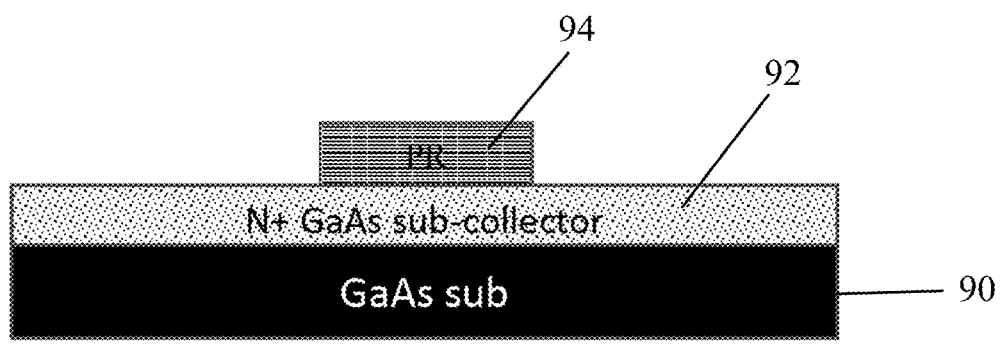
Figure 6C:
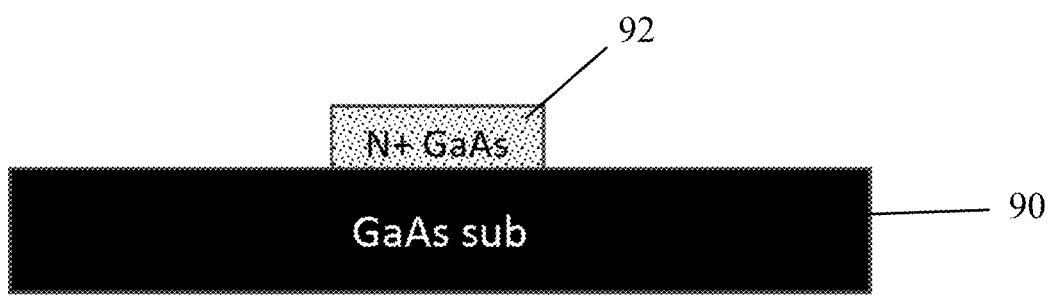
Figure 6D:
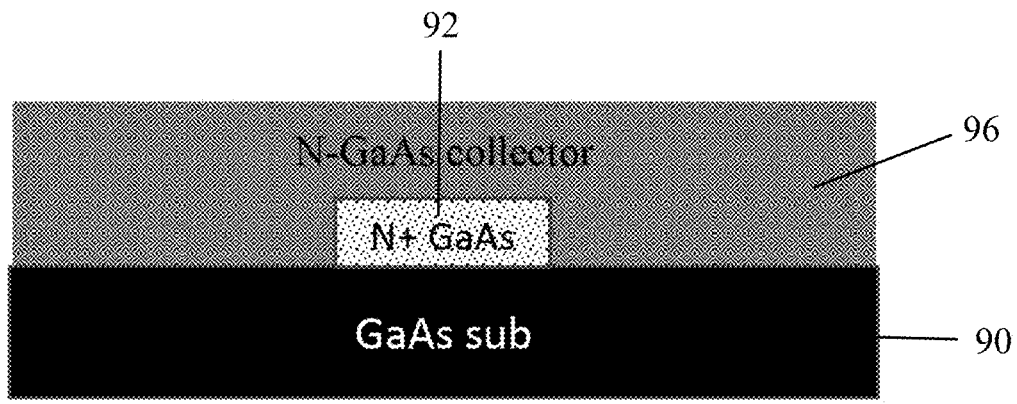
Figure 6E:
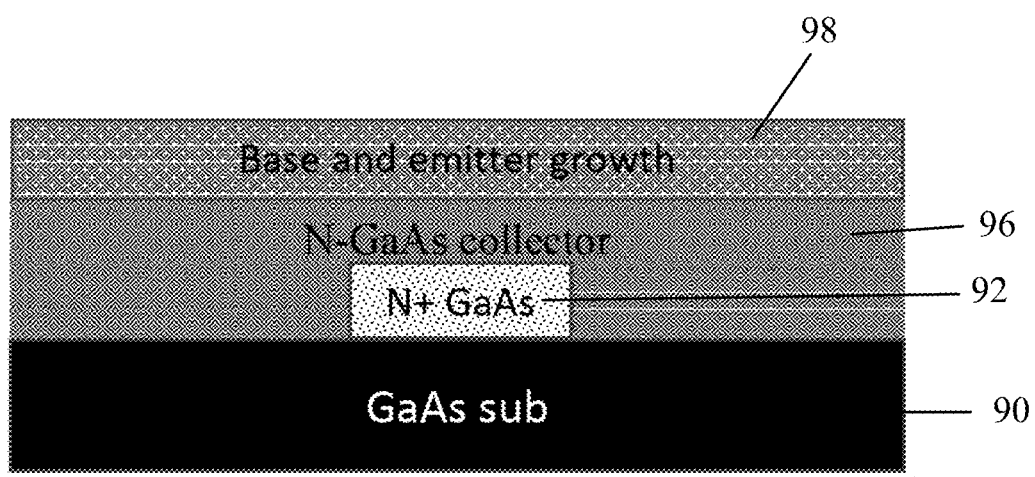

In a third approach for the realization of the HBT 74 in FIG. 3C, a overgrowth process (non-selective growth) is pursued, as shown in FIGS. 6A-6E. Heavily Si doped GaAs, in the range of about 0.2 μm to about 2 μm on a GaAs substrate 90, or a N+ GaAs substrate can be employed as a starting material, as shown in FIG. 6A. The reduced sub-collector is defined by photolithography and etching processes through the substrate by use of a photoresist (PR) 94, as shown in FIG. 6B-6C. The etched substrate goes through wet chemical cleaning. The lightly Si doped dual collector layers 96, in the range of about 0.5 μm to about 1.5 μm, is grown after planarizing a growth surface as shown in FIG. 6D. Therefore, the subsequent growth 98 for a base and an emitter for complete devices stacks can be executed with no growth break as shown in FIG. 6E.

Once all of the growth processes for the three structures 70, 72, 74 described above are completed, a device fabrication process can be executed. For example, at first, the emitter mesa is defined by photolithography and etching processes. The base metal contact area is defined by a photolithography process. Such processes are followed by a metallization method such as evaporation or sputtering and lift-off. The base mesa is defined by photolithography and etching processes as well. The collector metal contact area is defined by a photolithography process, which is then followed by a metallization method such as evaporation or sputtering and lift-off. The unit cell is isolated by another mesa etching definition or by He+ ion implantation.

Therefore, by using selective growth or overgrowth of the collector and the sub-collector as in the present invention, the layout for the device stacks is properly organized because the epitaxial overgrowth for device stacks is substantially planarized, unlike in the prior art. In addition, by using selective growth or overgrowth of the collector and the sub-collector without ion implantation, ion damage is prevented which further avoids degradation of crystal quality of the subsequently formed layers on top of the collector and/or the sub-collector.

Figure 7:
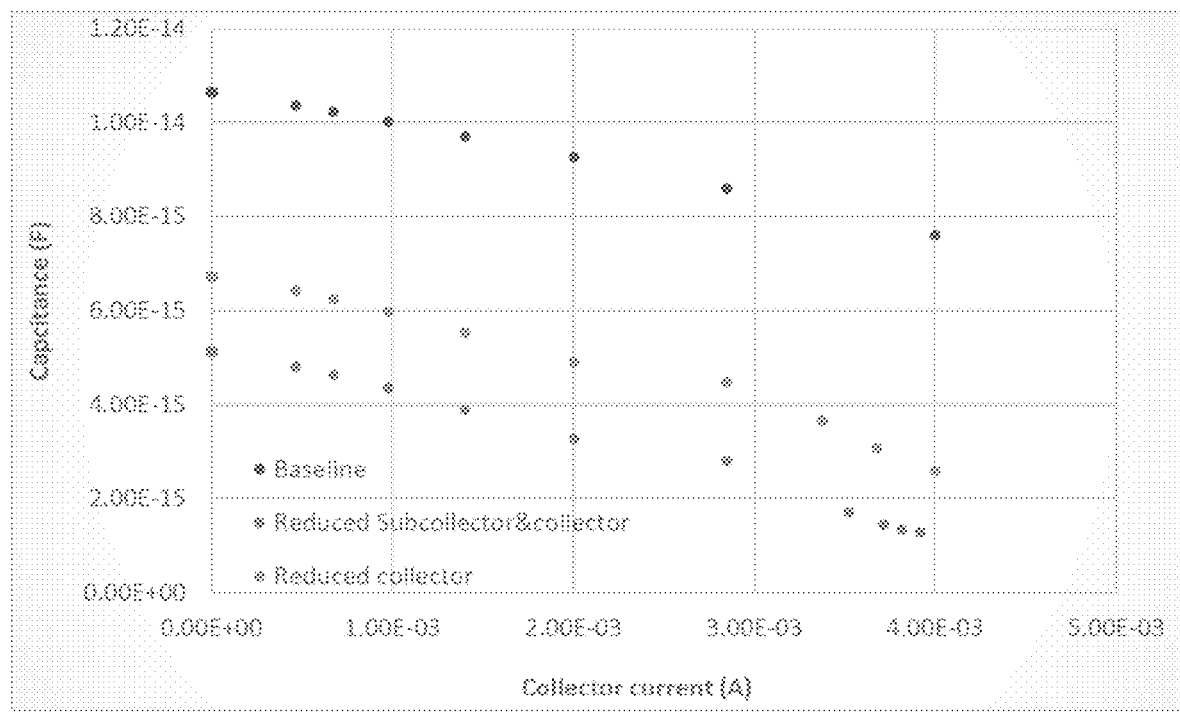
FIG. 7 is a graph of $C_{bc}$ of HBTs vs. collector current with and without the present invention.

By implementing a selectively grown or overgrown collector/sub-collector in the present invention such that the lateral areas of the collector and/or sub-collector is less than the lateral area of the base, the base-collector capacitance $C_{bc}$ is significantly reduced in the three inventive structures 70, 72, 74 as exemplified in FIGS. 3A-3C and 4B. Fabricating such structures 70, 72, 74 mitigates the third order distortion and enhance the device performance such as the maximum gain Gmax. FIG. 7 is a graph illustrating the simulated capacitance between base and collector as a function of collector current. Three different structures are employed for comparison in FIG. 7: the baseline configuration which is the HBT structure in the prior art, as shown in FIG. 4A; the reduced collector structure 72 as shown in FIG. 3B; and the reduced collector and sub-collector structure 70 as shown in FIG. 3A. As compared to the baseline structure in the prior art, there is a significant reduction of $C_{bc}$ all throughout the collector current range when the structures with the reduced collector and collector/sub-collector are utilized as in the present invention. The structure 70 shown in FIG. 3A with the reduced collector/sub-collector has the most pronounced effect in terms of the reduction of $C_{bc}$, especially at a typical device operating condition of about 2.85 mA. The structures 72 and 70 shown in FIGS. 3B and 3A, respectively, having the reduced collector and sub-collector, perform with $C_{bc}$ reductions of about 47% and about 67%, respectively.

Figure 8A:
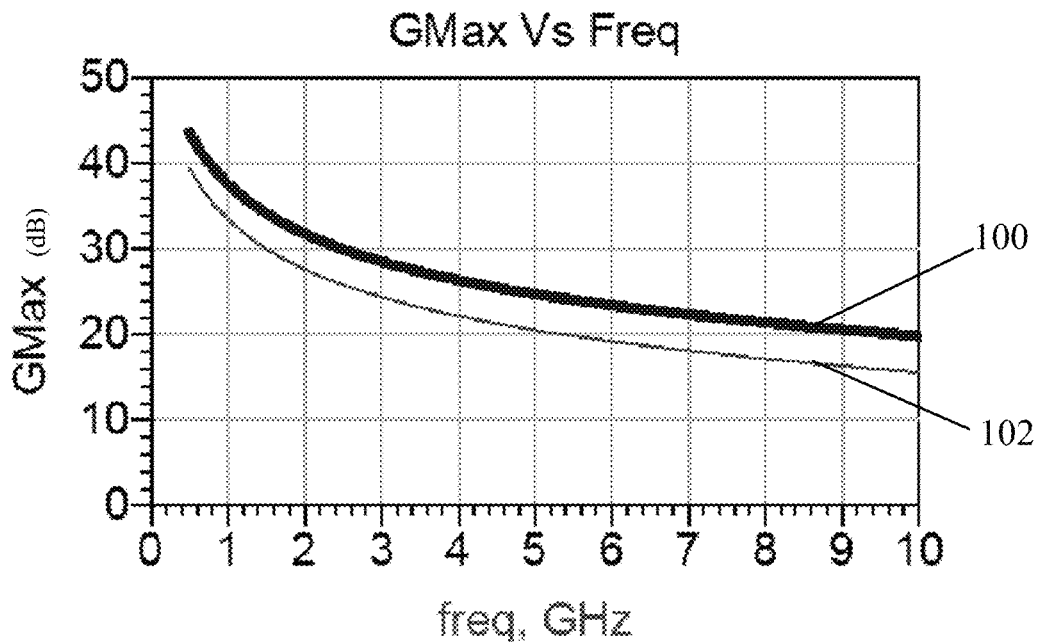
FIG. 8A is a graph of Gmax of an HBT vs. frequency with and without the present invention.

The maximum gain Gmax that can be achieved by a transistor is a very important figure of merit. If there is a substantial difference, on the order of greater than about 3 dB, amplifiers with fewer gain stages are needed which can result with an overall higher efficiency. FIG. 8A compares the simulated RF device performance of Gmax in dB vs frequency. It can be seen that the present invention can increase gain by as much as 5 dB. The bold line curve 100 and the thin line curve 102 represent the structures with the reduced collector/sub-collector, as shown in FIG. 3A, and the baseline structure in the prior art, respectively.

Figure 8B:
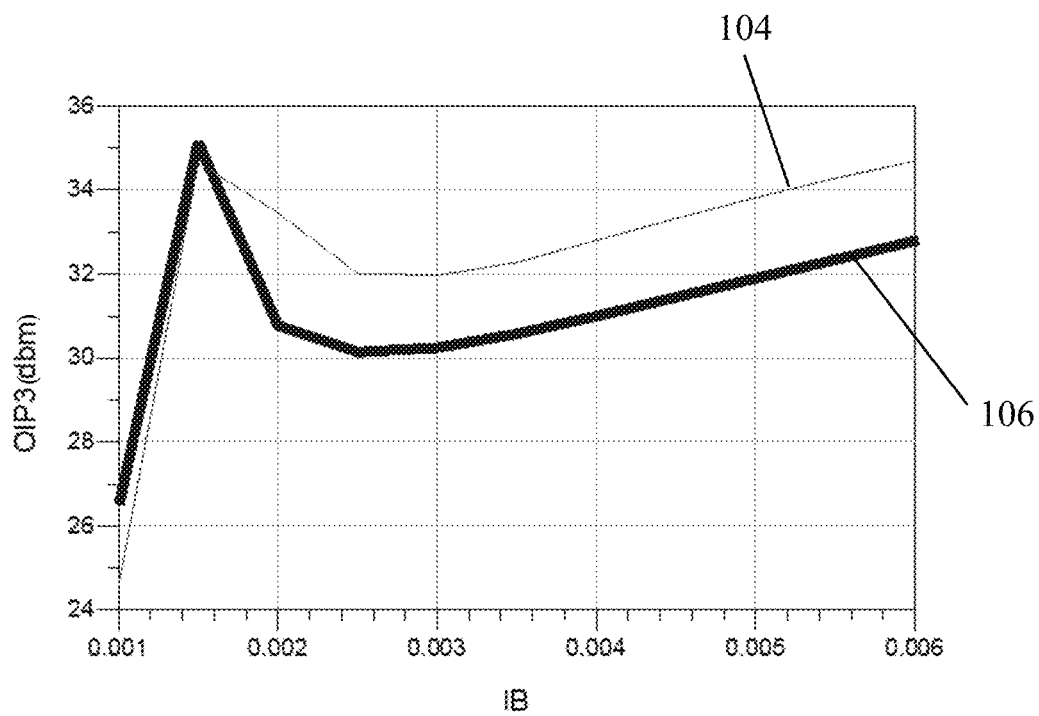
FIG. 8B is a graph of the OIP3 parameter of an HBT vs. base current with and without the present invention.

Another important figure of merit is the third order output intercept point (OIP3). The OIP3 in a bipolar transistor is greatly affected by a non-linear $C_{bc}$ capacitance and currents from the base-collector diode. FIG. 8B shows a simulation of the OPI3 of a transistor in dBm vs. the base current, with the transistor implementing the present invention, as illustrated by the thin line 104, while the performance of a transistor in the prior art and without the present invention is illustrated by the thick line 106. The top thin curve 104 representing the performance of a transistor implementing the present invention shows an improvement in OIP3 of 2 dBm over a wide range of base current bias points.

In alternative embodiments of the fabrication of the HBTs of the present invention, the growth or deposition of any subset of semiconductor materials may be done by metal-organic chemical vapor deposition (MOCVD) or by molecular beam epitaxy (MBE). In addition, etching may be done by known wet chemical, dry chemical or mechanical techniques, or any combination thereof. In further alternative embodiments, lithography may be accomplished by electron beam or ultraviolet resists and by using corresponding developers. In addition, metallization may be accomplished by electron-beam evaporation, thermal evaporation, radio-frequency sputtering, or by electroplating in either a liftoff or a dry-etch process, in any combination, followed by annealing if necessary.

In alternative embodiments of the HBTs of the present invention, insulators may be composed of silicon dioxide, silicon nitride, aluminum oxide, magnesium oxide, poly-mers or any of several well-known choices. Their deposition may be done by plasma-enhanced chemical vapor deposition (PECVD), atomic layer deposition (ALD), sputtering, or any of several known techniques or variants thereof. In addition, one or more passivation layers and metallization layers may be added to the device structures 70, 72, 74 of the present invention as described herein.

The present invention may be embodied in other specific forms without departing from its spirit or essential characteristics. The described embodiments are to be considered in all respects only as illustrative and not restrictive. The scope of the invention, therefore, will be indicated by claims rather than by the foregoing description. All changes, which come within the meaning and range of equivalency of the claims, are to be embraced within their scope.

What is claimed is:

1. A method for fabricating a transistor comprising:
deposit a material on a substrate;
perform photolithography and etching through the material to the substrate to form an exposed substrate area;
selectively grow a sub-collector and a collector on the exposed substrate area without ion implantation, wherein a second area to which the direction of stacking of the sub-collector and the collector is normal; and
form a base and an emitter, wherein a first area to which the direction of stacking of the base and the collector is normal;
wherein the second area is selectively gorwn to be less than the first area.

2. The method of claim 1, wherein the second area being less than the first area reduces a base-collector capacitance.

3. A method for fabricating a transistor comprising:
deposit a sub-collector material on a substrate;
perform photolithography and etching through the sub-collector material to the substrate to form an exposed substrate area and a sub-collector area;
overgrow a collector on the exposed substrate area and on the sub-collector area without ion implantation; and
form a base and an emitter.

4. The method of claim 3, wherein a second area to which the direction of the sub-collector and the collector is normal is formed to be less than a first area to which the direction of the base and the collector is normal.

5. The method of claim 4, wherein the second area being less than the first area reduces a base-collector capacitance.

* * * * *